United States Patent
Hynes et al.

[11] Patent Number: 6,132,809
[45] Date of Patent: Oct. 17, 2000

[54] CONFORMAL COATING USING MULTIPLE APPLICATIONS

[75] Inventors: Anthony J. Hynes, Ballston Spa; Jonathan Neal Urquhart, Troy, both of N.Y.

[73] Assignee: Precision Valve & Automation, Inc., Halfmoon, N.Y.

[21] Appl. No.: 09/001,382

[22] Filed: Dec. 31, 1997

[51] Int. Cl.[7] ........................................... B05C 5/00
[52] U.S. Cl. ..................... 427/421; 118/313; 118/315; 118/679; 901/43
[58] Field of Search ..................... 118/669, 679, 118/680, 681, 695, 696, 697, 704, 300, 313, 315, 323, 304; 901/43; 427/421, 428

[56] References Cited

U.S. PATENT DOCUMENTS

| | | | |
|---|---|---|---|
| Re. 34,197 | 3/1993 | Engel | 118/680 |
| 3,561,398 | 2/1971 | Rose et al. | 118/323 X |
| 4,119,058 | 10/1978 | Schmermund | 118/411 |
| 4,414,248 | 11/1983 | Kolibas | 427/236 |
| 4,476,165 | 10/1984 | McIntyre | 427/258 |
| 4,485,387 | 11/1984 | Drumheller | 346/140 R |
| 4,572,103 | 2/1986 | Engel | 118/697 |
| 4,584,964 | 4/1986 | Engel | 118/697 |
| 4,692,351 | 9/1987 | Maeda et al. | 427/196 |
| 4,868,007 | 9/1989 | Taguchi | 427/96 |
| 4,872,417 | 10/1989 | Kuwabara et al. | 118/411 |
| 4,919,074 | 4/1990 | Kurihara et al. | 118/69 |
| 4,941,428 | 7/1990 | Engel | 118/680 |
| 4,951,600 | 8/1990 | Soshi et al. | 118/696 |
| 4,967,933 | 11/1990 | Maiorca et al. | 222/1 |
| 5,017,409 | 5/1991 | Bok | 427/424 |
| 5,141,165 | 8/1992 | Sharpless et al. | 239/752 |
| 5,186,982 | 2/1993 | Blette et al. | 427/256 |
| 5,271,953 | 12/1993 | Litteral | 427/8 |
| 5,273,059 | 12/1993 | Gross et al. | 118/323 X |
| 5,377,913 | 1/1995 | Van Der Woude | 239/227 |
| 5,482,553 | 1/1996 | Loftin et al. | 118/302 |
| 5,505,777 | 4/1996 | Ciardella et al. | 118/663 |
| 5,720,820 | 2/1998 | Boger et al. | 118/669 |
| 5,871,822 | 2/1999 | Lepsche et al. | 427/424 |

FOREIGN PATENT DOCUMENTS

| | | |
|---|---|---|
| 310372 | 4/1989 | European Pat. Off. . |
| 453269 | 4/1991 | European Pat. Off. . |
| 11-104578 | 4/1999 | Japan . |
| 86/03366 | 6/1986 | WIPO . |

*Primary Examiner*—Francis J Lorin
*Attorney, Agent, or Firm*—Heslin & Rothenberg, P.C.; Wayne F. Reinke

[57] ABSTRACT

A robotic conformal coating system has a end effector and multiple tiltable valves coupled to the end effector. The end effector is capable of X, Y and Z axis motion, as well as rotation about the Z axis. A programmable controller controls the movement of the end effector and valves, as well as the actual dispensing and/or spraying of conformal coating.

20 Claims, 7 Drawing Sheets

CONFORMAL COATING USING MULTIPLE APPLICATIONS

BACKGROUND OF THE INVENTION

1. Technical Field

The present invention generally relates to conformal coating of objects. More particularly, the present invention relates to a method and system for conformally coating objects, such as circuit boards.

2. Background Information

Conformal coating, such as, for example, acrylic, urethane or silicone, is used to, for example, protect the components on a circuit board from moisture, chemicals, dust, and shock. Conformal coating on circuit boards also acts as an insulator for electricity and heat. Because of this insulating property, some areas of a circuit board usually cannot be conformally coated, in order to preserve the electrical and/or heat conduction. Thus, conformal coating for circuit boards is performed selectively.

To accomplish selective conformal coating, requiring very precise applications, robotic dispensing systems have been employed. Such systems heretofore have provided relatively precise dispensing of conformal coating on small circuit board components, as well as the ability to spray conformal coating across larger areas of a circuit board.

However, existing robotic conformal coating systems employ a single valve. The use of a single valve is limiting in a number of ways. For example, a single type of head cannot generally provide multiple spray options tailored to the object or portion of the object that needs to be coated, e.g., wide spray versus thin stream. As another example, a single valve restricts the timing efficiency of the system.

Thus, a need exists for an improved way to apply conformal coating.

SUMMARY OF THE INVENTION

Briefly, the present invention satisfies the need for improved conformal coating by employing multiple coating applicators for multiple dispensing options and/or to improve coating efficiency.

In accordance with the above, it is an object of the present invention to provide improved conformal coating.

The present invention provides, in a first aspect, a conformal coating system. The system comprises at least one end effector, and a plurality of coating applicators coupled to the at least one end effector for applying conformal coating.

The present invention provides, in a second aspect, a method of conformally coating an object with a conformal coating system including at least one end effector capable of X, Y and Z axis movement and rotational movement about at least one axis, and a plurality of tiltable coating applicators coupled to the at least one end effector for conformal coating. The method comprises causing the at least one end effector to traverse a path along a perimeter of the object by movement along one or more axis and/or rotational movement; and dispensing conformal coating about the object through one or more of the tiltable coating applicators, the one or more applicators being tilted during the dispensing.

These, and other objects, features and advantages of this invention will become apparent from the following detailed description of the various aspects of the invention taken in conjunction with the accompanying drawings.

BEST MODE FOR CARRYING OUT THE INVENTION

Figure 1:
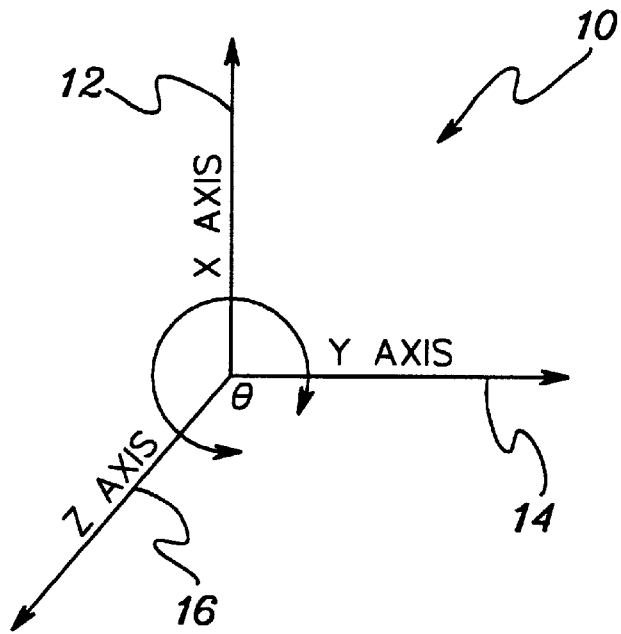
FIG. 1 depicts a cartesian coordinate system useful in describing the operation of the system of the present invention.

FIG. 1 depicts a cartesian coordinate system 10 showing the four axes of movement relevant to the present invention. Coordinate system 10 comprises X axis 12, Y axis 14, Z axis 16, and θ (theta) axis 18. The θ axis 18 constitutes circular motion about the Z axis 16.

Figure 2:
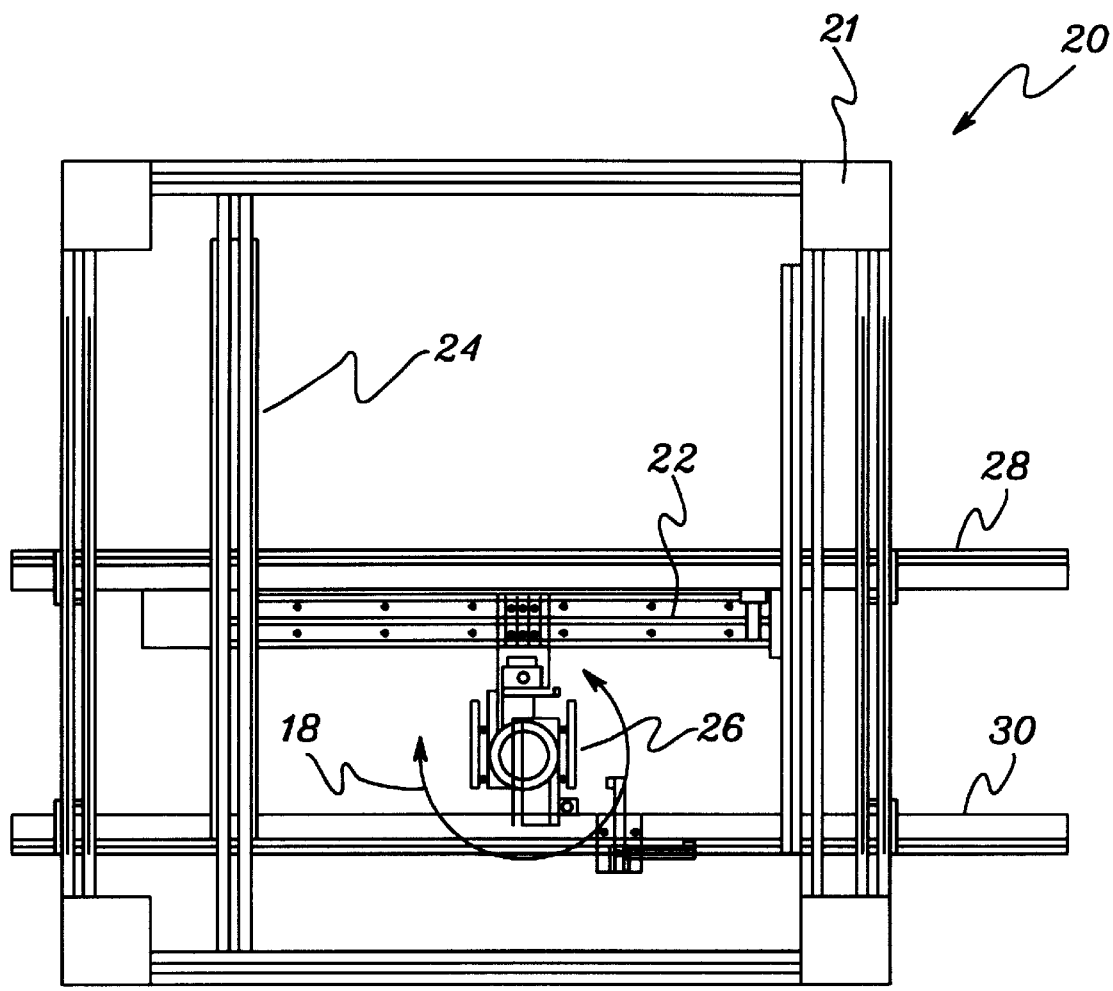
FIG. 2 is a top view of one embodiment of a conformal coating system according to the present invention.

FIG. 2 is a top view of an exemplary conformal coating system 20 according to the present invention. System 20 comprises frame 21, Y axis ball screw slide 22, X axis ball screw slide 24 and end effector 26. End effector 26 is capable of rotation about the θ axis 18. End effector 26 moves left and right along the Y axis by sliding along Y axis ball screw slide 22. Similarly, end effector 26 moves back and forth along the X axis by sliding, along with frame members 28 and 30 and Y axis ball screw slide 22, along X axis ball screw slide 24.

Figure 3:
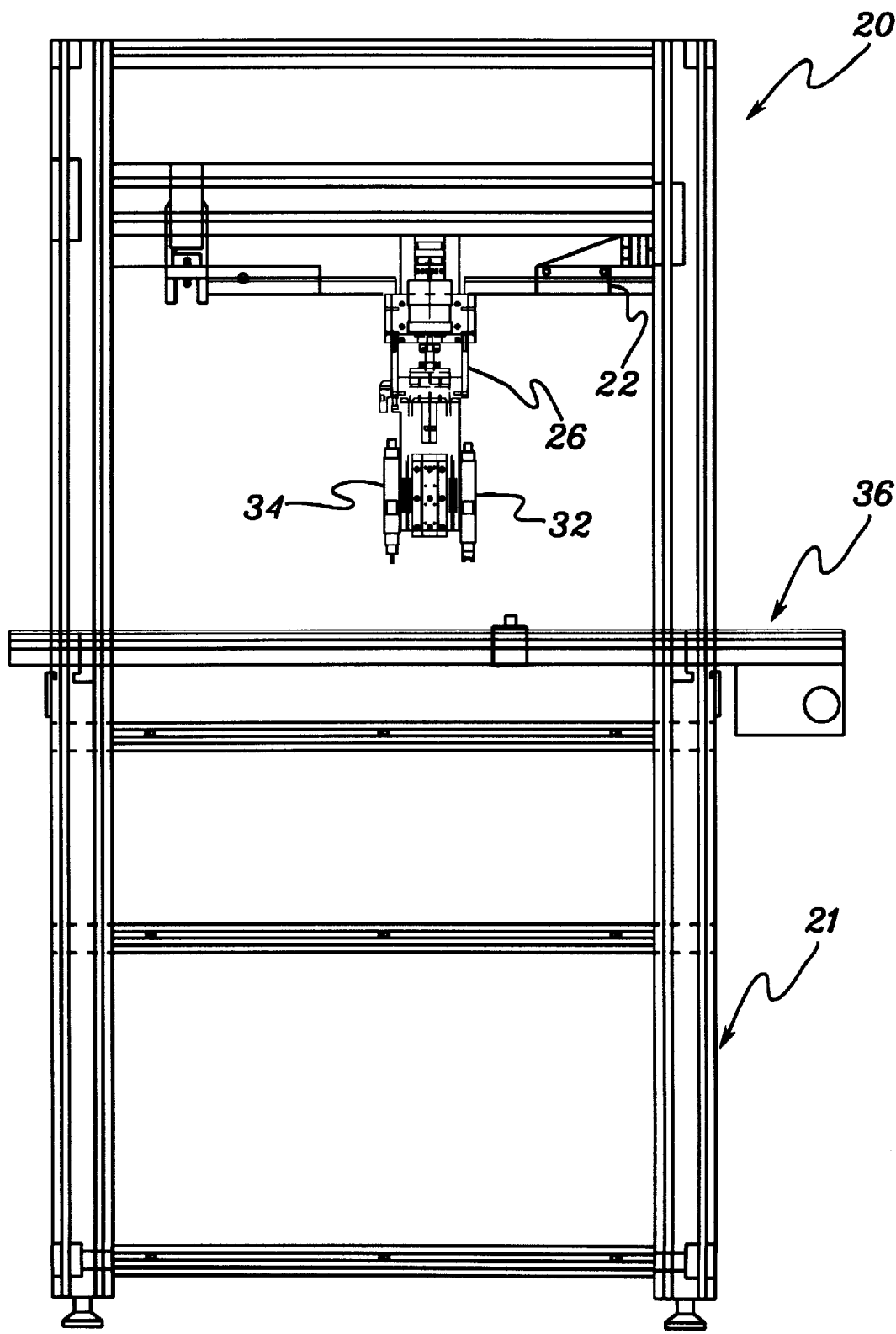
FIG. 3 is a front view of the conformal coating system of FIG. 2.

FIG. 3 is a front view of the conformal coating system 20 of FIG. 2. As shown in FIG. 3, attached to end effector 26 are spray valve 32 and dispensing valve 34. Spray valve 32 is a pneumatically actuated valve that combines conformal coating with pressurized air to dispense an atomized spray pattern, such as, for example, a round spray pattern. Dispensing valve 34, also referred to as a "needle valve," is also a pneumatically actuated valve, but flows conformal coating through an interchangeable needle orifice. Also shown attached to frame 21 is belt conveyor 36. Belt conveyor 36 is used to move a work piece or object through the conformal coating system and along to another station in a production process. For example, if electronic components on a circuit board are being conformally coated, belt conveyor 36 may move the circuit board into, for example, an oven for curing. Frame 21 could be made of, for example, extruded aluminum.

Figure 4:
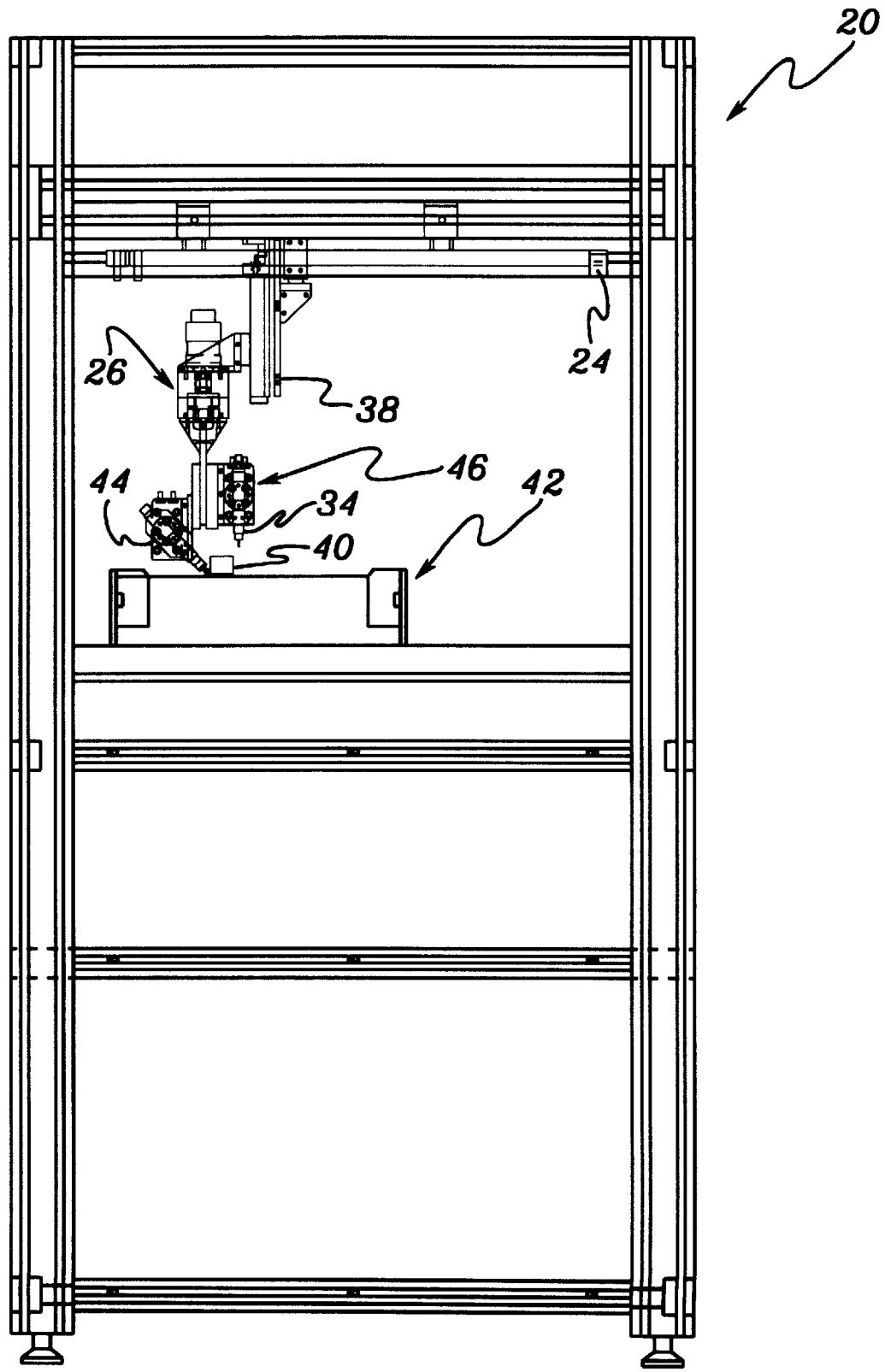
FIG. 4 is a side view of the conformal coating system of FIG. 2.

FIG. 4 is a side view of the conformal coating system 20 of FIG. 2. End effector 26 moves up and down on the Z axis by sliding on Z axis ball screw slide 38. Valve 32 is shown in use spraying conformal coating underneath an electrical component 40 on a circuit board 42. As shown in FIG. 4, spray valve 32 is tilted on pneumatic tilt axis 44. Similarly, though not being titled in FIG. 4, dispensing valve 34 is also mounted on a pneumatic tilt axis 46. Each pneumatic tilt axis is in turn connected to end effector 26. Preferably, end effector 26 is rotatable up to at least about 336° on the θ axis 18.

As used herein, the term "coating applicator" refers to a portion of a conformal coating system from which the conformal coating is dispensed, such as, for example, a dispensing valve or a spray valve. As used herein, the term "end effector" refers to any device(s) attached to an x, y, z, or other axis of movement to perform various applications, such as, for example, dispensing, pick and place, routing, etc.

Figure 5:
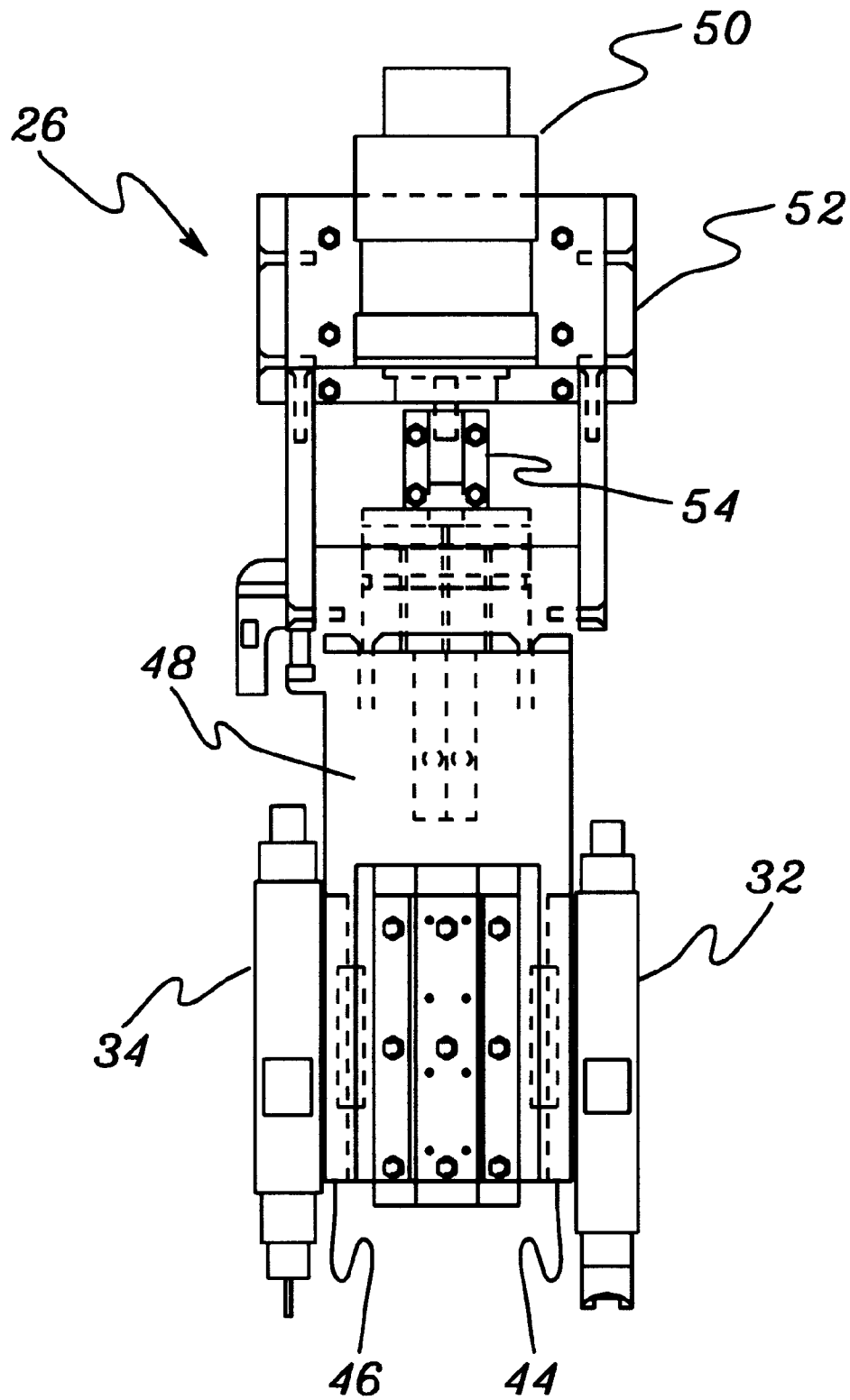
FIG. 5 depicts in more detail the coating applicator portion of the conformal coating system of FIG. 2.

FIG. 5 depicts in greater detail the end effector 26 and valves of the conformal coating system of FIG. 2. Valves 32 and 34 are mounted on pneumatic tilt axes 44 and 46, respectively. In turn, the tilt axes are connected to the end effector via mounting plate 48. End effector 26 comprises brushless servo motor 50 for movement about the θ axis, a mounting assembly 52 (shown best in FIG. 6) for connecting the brushless servo motor to the Z axis ball screw slide, and zero backlash coupling 54 for preventing sudden starts and stops of the servo motor.

Figure 6:
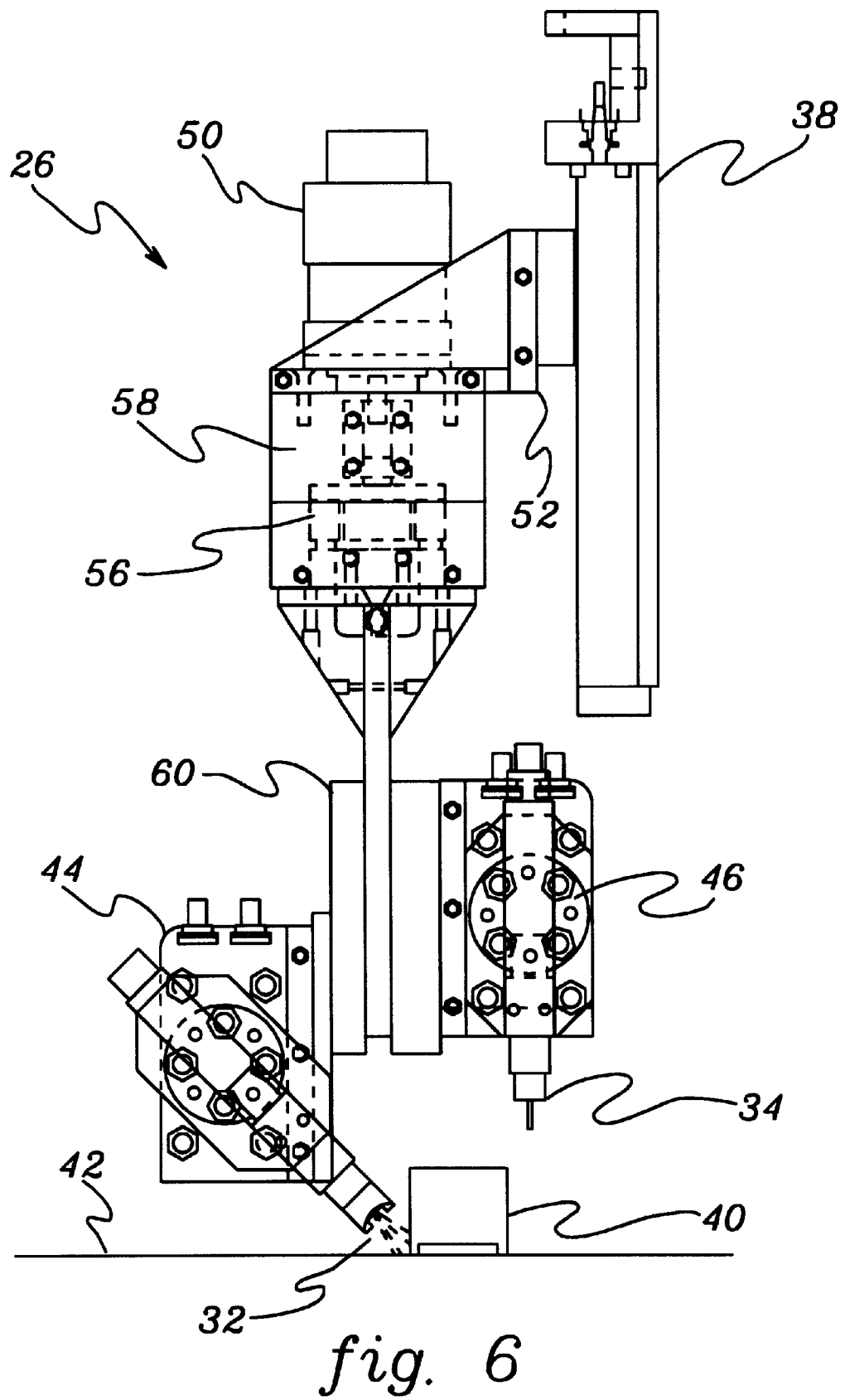
FIG. 6 depicts the end effector portion of the conformal coating system of FIG. 4 in greater detail, showing one of the coating applicators coating an object.

FIG. 6 depicts the conformal coating system of FIG. 4 in detail, showing spray valve 32 coating electrical component 40 of circuit board 42. FIG. 6 shows most clearly the mounting assembly 52 connecting brushless servo motor 50 with Z axis ball screw slide 38. Also shown are bearings 56 for supporting a load and providing the axis for rotation, support plate 58 for the bearings, and linear pneumatic slide 60 allowing the valves and their associated tilt axes to move independently a short distance (about 50 mm) up and down along the Z axis.

Figure 7:
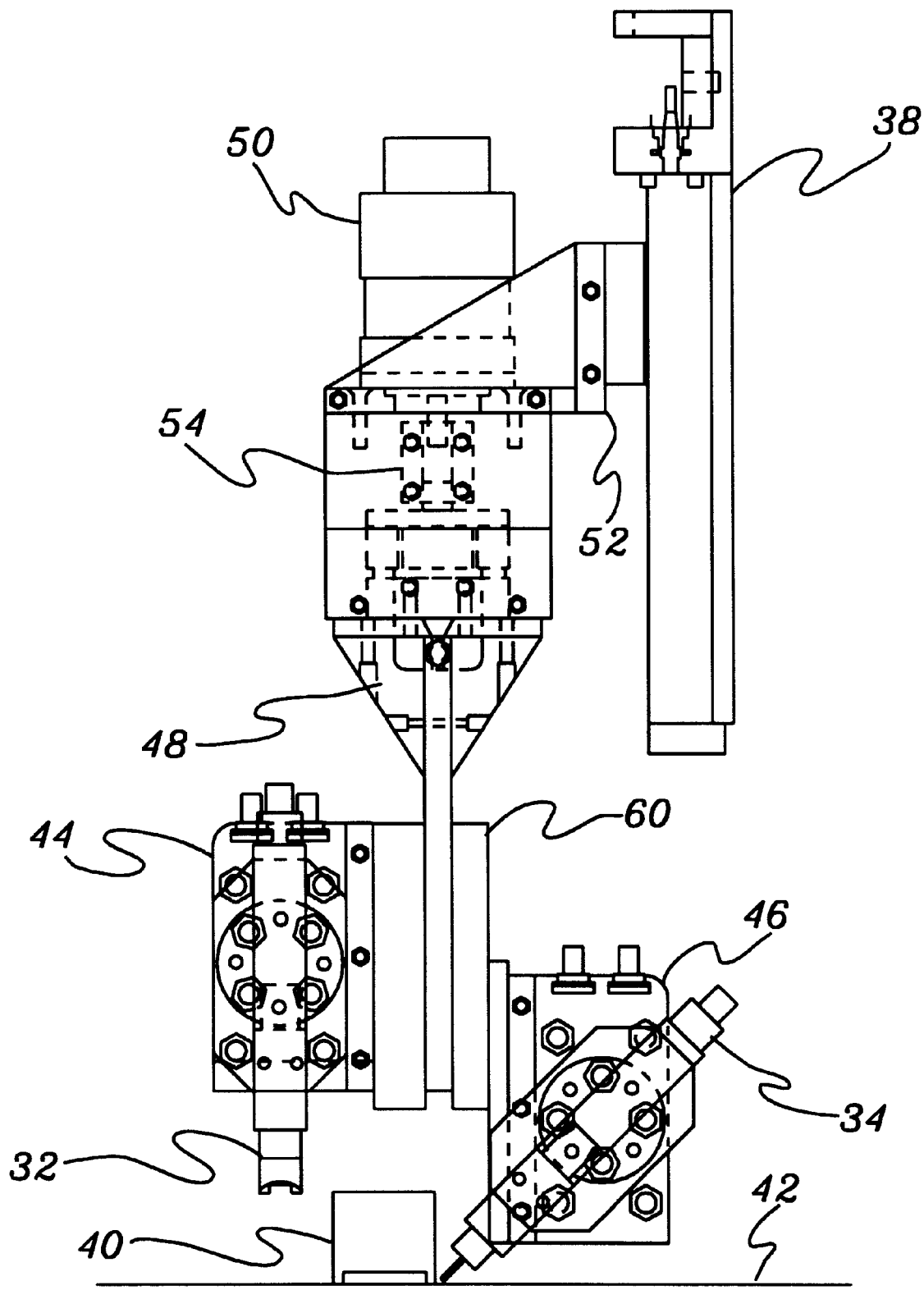
FIG. 7 depicts the system portion of FIG. 6, except that the other coating applicator is shown in use.

FIG. 7 depicts the conformal coating system portion of FIG. 6, except that the other coating applicator is shown in use. More specifically, dispensing valve 34 is shown tilted 45° with respect to the Z axis 16, dispensing conformal coating underneath component 40.

Figure 8:
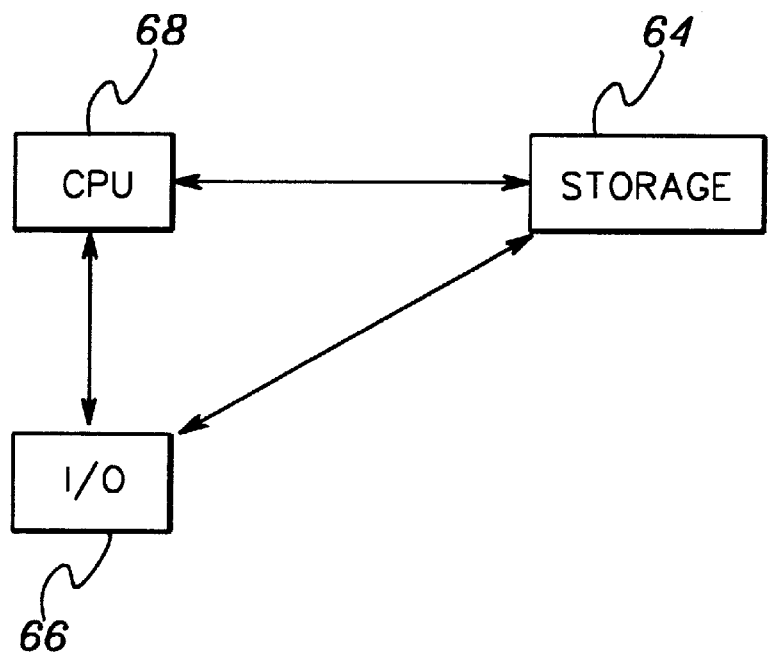
FIG. 8 is a block diagram of an exemplary controller useful with the present invention.

FIG. 8 is a block diagram of an exemplary programmable controller 62 useful with the present invention. Although it can take various forms, controller 62 preferably comprises a microprocessor based, stand-alone microcomputer. The controller is programmed to and capable of performing simultaneous multi-axis coordinated motion with precision, accuracy and repeatability. A non-volatile memory 64 stores the control program, input via I/O device 66, and may comprise, for example, EEPROMs. I/O device 66 may comprise, for example, a keyboard. The backbone of controller 62 is microprocessor or CPU 68, preferably at least a 32-bit microprocessor. Performance characteristics preferably include at least 8,000,000 encoder counts per second axis position feedback, and at least a 125 microsecond per axis position update rate.

While several aspects of the present invention have been described and depicted herein, alternative aspects may be effected by those skilled in the art to accomplish the same objectives. Accordingly, it is intended by the appended claims to cover all such alternative aspects as fall within the true spirit and scope of the invention.

What is claimed is:

1. A conformal coating system, comprising:
   at least one end effector; and
   a plurality of coating applicators coupled to the at least one end effector for applying conformal coating, wherein the plurality of coating applicators are independently operable.

2. The system of claim 1, wherein the plurality of coating applicators comprises:
   at least one dispensing valve for dispensing conformal coating about an object; and
   at least one spray valve for spraying conformal coating about an object.

3. The system of claim 2, wherein the at least one dispensing valve is capable of dispensing conformal coating on top of and/or underneath an object, and wherein the at least one spray valve is capable of spraying conformal coating on top of, underneath and/or around an object.

4. The system of claim 1, wherein the at least one end effector is capable of sideways movement along an X axis, front and back movement along a Y axis, up and down movement along a Z axis and rotational movement about at least one axis of the X axis, the Y axis and the Z axis.

5. The system of claim 4, wherein the at least one axis comprises the Z axis.

6. The system of claim 4, further comprising a controller programmable to control the X axis, Y axis and Z axis movement, and the rotational movement about the at least one axis of the end effector.

7. The system of claim 6, wherein the controller is further programmable to control conformal coating dispensing through the plurality of coating applicators.

8. The system of claim 1, wherein each of the plurality of coating applicators is mounted on a tiltable axis that is mounted on the at least one end effector.

9. The system of claim 8, wherein each tiltable axis is tiltable up to about 45 degrees with respect to the Z axis.

10. A robotic conformal coating system, comprising:
    at least one end effector capable of sideways movement along an X axis, front and back movement along a Y axis, up and down movement along a Z axis and rotational movement about at least one axis of the X axis, the Y axis and the Z axis;
    a plurality of tiltable coating applicators coupled to the at least one end effector for applying conformal coating, wherein the plurality of coating applicators are independently operable; and
    a controller programmable to control tilting of the plurality of tiltable coating applicators and movement of the at least one end effector.

11. The system of claim 10, wherein the at least one axis comprises the Z axis.

12. The system of claim 10, wherein the plurality of tiltable coating applicators comprises:
    at least one dispensing valve for dispensing conformal coating about an object; and
    at least one spray valve for spraying conformal coating about an object.

13. The system of claim 12, wherein the at least one dispensing valve is capable of dispensing conformal coating on top of and/or underneath an object, and wherein the at least one spray valve is capable of spraying conformal coating on top of, underneath and/or around an object.

14. The system of claim 10, wherein each of the plurality of tiltable coating applicators is mounted on a tiltable axis that is mounted on the at least one end effector.

15. The system of claim 14, wherein each tiltable axis is tiltable up to about 45 degrees with respect to the Z axis.

16. A method of conformally coating an object with a conformal coating system including at least one end effector capable of sideways movement along an X axis, front and back movement along a Y axis, up and down movement along a Z axis and rotational movement about at least one axis of the X axis, the Y axis and the Z axis, and a plurality of independently operable tiltable coating applicators coupled to the at least one end effector for applying conformal coating, the method comprising steps of:
    causing the at least one end effector to traverse a path along a perimeter of the object by one or more of movement along the X axis, movement along the Y axis, movement along the Z axis, and rotational movement about the at least one axis; and dispensing conformal coating about the object through one or more of the plurality of tiltable coating applicators, wherein the one or more of the plurality of tiltable coating applicators is tilted during the dispensing.

17. The method of claim 16, wherein the at least one axis comprises the Z axis.

18. The method of claim 16, wherein the conformal coating system further includes a controller programmable to control movement of the at least one end effector and tilting of the plurality of tiltable coating applicators, and wherein the step of causing is performed automatically by the controller.

19. The method of claim 18, wherein the controller is further programmable to control dispensing of conformal coating through the plurality of tiltable coating applicators, and wherein the step of dispensing is performed automatically by the programmable controller.

20. The method of claim 16, wherein the plurality of tiltable coating applicators includes at least one dispensing valve and at least one spray valve, and wherein the step of dispensing comprises steps of:

manipulating the at least one spray valve to spray conformal coating on top of, underneath and/or around the object; and manipulating the at least one dispensing valve to dispense conformal coating on top of and/or underneath the object.

* * * * *

UNITED STATES PATENT AND TRADEMARK OFFICE
CERTIFICATE OF CORRECTION

PATENT NO. : 6,132,809
DATED : October 17, 2000
INVENTOR(S) : Hynes, et al.

It is certified that error appears in the above-identified patent and that said Letters Patent is hereby corrected as shown below:

```
On the title page,
[54] delete "Applications" and insert the word --Applications--
```

Signed and Sealed this

Fifteenth Day of May, 2001

Attest:

NICHOLAS P. GODICI

Attesting Officer

Acting Director of the United States Patent and Trademark Office

UNITED STATES PATENT AND TRADEMARK OFFICE
CERTIFICATE OF CORRECTION

PATENT NO. : 6,132,809
DATED : October 17, 2000
INVENTOR(S) : Anthony J. Hynes et al.

It is certified that error appears in the above-identified patent and that said Letters Patent is hereby corrected as shown below:

<u>Title Page,</u>

Insert the following: --Related U.S. Application Data:

This Application is a Provisional of Serial Number 60/035,574 filed on January 16, 1997.--

Signed and Sealed this

Tenth Day of July, 2001

*Attest:*

NICHOLAS P. GODICI
*Attesting Officer*     *Acting Director of the United States Patent and Trademark Office*

UNITED STATES PATENT AND TRADEMARK OFFICE
CERTIFICATE OF CORRECTION

PATENT NO. : 6,132,809
DATED : October 17, 2000
INVENTOR(S) : Hynes et al.

Page 1 of 1

It is certified that error appears in the above-identified patent and that said Letters Patent is hereby corrected as shown below:

Title page,
Item [54], line 2 of the title, delete "APPLICATIONS" and replace with
-- APPLICATORS --.

Column 1,
Line 2, delete "APPLICATIONS" and replace with -- APPLICATORS --.

This Certificate supersedes Certificate of Correction issued May 15, 2001.

Signed and Sealed this

Twenty-fifth Day of December, 2001

Attest:

*Attesting Officer*

JAMES E. ROGAN
*Director of the United States Patent and Trademark Office*